US010382190B1

(12) United States Patent
Sharma et al.

(10) Patent No.: US 10,382,190 B1
(45) Date of Patent: Aug. 13, 2019

(54) OPTIMIZING CLOCK/DATA RECOVERY POWER WHILE MAINTAINING LINK STABILITY IN SOURCE SYNCHRONOUS APPLICATIONS

(71) Applicant: QUALCOMM Incorporated, San Diego, CA (US)

(72) Inventors: Rajeev Sharma, Oceanside, CA (US); Santhosh Kumar Gude, San Jose, CA (US); Parth Patel, San Diego, CA (US); Hadi Goudarzi, San Diego, CA (US); Eskinder Hailu, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/035,575

(22) Filed: Jul. 13, 2018

(51) Int. Cl.
*H04L 7/00* (2006.01)
*H04L 7/033* (2006.01)
*G06F 1/26* (2006.01)
*G06F 13/362* (2006.01)

(52) U.S. Cl.
CPC ............ *H04L 7/0331* (2013.01); *G06F 1/266* (2013.01); *G06F 13/362* (2013.01)

(58) Field of Classification Search
CPC ....... H04L 7/0331; G06F 1/266; G06F 13/362
USPC .......................................................... 375/354
See application file for complete search history.

(56) References Cited

U.S. PATENT DOCUMENTS

| 7,916,820 | B2 | 3/2011 | Cranford et al. | |
|---|---|---|---|---|
| 9,485,080 | B1 | 11/2016 | Duan et al. | |
| 9,684,624 | B2 | 6/2017 | Sengoku et al. | |
| 2006/0034394 | A1* | 2/2006 | Popescu | H03L 7/087 375/326 |
| 2007/0283297 | A1* | 12/2007 | Hein | G11C 7/22 716/100 |
| 2008/0137789 | A1* | 6/2008 | Cranford | H04L 7/042 375/354 |
| 2012/0216095 | A1* | 8/2012 | Ha | G06F 11/1004 714/758 |
| 2016/0019183 | A1* | 1/2016 | Thurston | G06F 13/4291 710/106 |

OTHER PUBLICATIONS

"DS110RT410 Low-Power Multi-Rate Quad Channel Retimer," Texas Instruments Incorporated, Oct. 2015, pp. 1-60.
"Serdes Handbook," Lattice Semiconductor Corporation, Apr. 2003, 98 Pages.

* cited by examiner

*Primary Examiner* — Don N Vo
(74) *Attorney, Agent, or Firm* — Muncy, Geissler, Olds & Lowe, P.C

(57) ABSTRACT

A desirable feature of a SERDES design is power savings. One way to achieve power savings is by keeping the CDR circuit OFF during most of the time when a link is active between a transmitter and a receiver. However, due to voltage supply noise, temperature fluctuations and uncorrelated crosstalk, the receiver data may shift and/or the eye may collapse if the CDR is not turned ON to take care of these modulations. To address such disadvantages, it is proposed to generate a CDR profile that can specify optimum CDR ON and OFF time so that link stability may be maintained while saving power.

34 Claims, 11 Drawing Sheets

OPTIMIZING CLOCK/DATA RECOVERY POWER WHILE MAINTAINING LINK STABILITY IN SOURCE SYNCHRONOUS APPLICATIONS

FIELD OF DISCLOSURE

One or more aspects of the present disclosure generally relate to high speed peripherals, and in particular, to saving power in source synchronous applications while maintaining link stability.

BACKGROUND

A desirable feature of a SERDES (serializer/deserializer) design is power savings. One way to achieve power savings is by keeping a CDR (clock/data recovery) circuit OFF during most of the time when a link is active between a transmitter and a receiver. However, due to voltage supply noise, temperature fluctuations and uncorrelated crosstalk, the receiver data may shift and/or the eye may collapse if the CDR is not turned ON to take care of these modulations. Such undesirable modulations can cause link failures.

SUMMARY

This summary identifies features of some example aspects, and is not an exclusive or exhaustive description of the disclosed subject matter. Whether features or aspects are included in, or omitted from this summary is not intended as indicative of relative importance of such features. Additional features and aspects are described, and will become apparent to persons skilled in the art upon reading the following detailed description and viewing the drawings that form a part thereof.

An exemplary method is disclosed. The method may comprise generating, by a CDR (clock/data recovery) profiler, a CDR profile of a link. The link may couple a master and a slave of a data transfer system. The method may also comprise periodically activating and deactivating, by the data transfer system, a CDR circuit of the data transfer system based on the CDR profile to prevent an eye shift/collapse when transferring data between the master and the slave. The CDR profile may comprise one or more noise profiles. Each noise profile may comprise one or more profile entries. Each profile entry may include a CDR_ON time and a corresponding eye opening result. The CDR_ON time may specify a duration of a CDR_PERIOD in which the CDR circuit is active.

An exemplary apparatus is disclosed. The apparatus may comprise a data transfer system and a CDR (clock/data recovery) profiler. The data transfer system may comprise a master, a slave, and a link. The link may couple the master and the slave. The CDR profiler may be configured to generate a CDR profile of the link. The CDR profile may comprise one or more noise profiles. Each noise profile may comprise one or more profile entries. Each profile entry may include a CDR_ON time and a corresponding eye opening result. The CDR_ON time may specify a duration of a CDR_PERIOD in which the CDR circuit is active. The data transfer system may be configured to periodically activate and deactivate the CDR circuit based on the CDR profile to prevent an eye shift/collapse when transferring data between the master and the slave.

An exemplary CDR (clock/data recovery) profiler is disclosed. The CDR profiler may comprise a controller and a noise injector that are together configured to generate a CDR profile of a link. The link may couple a master and a slave of a data transfer system. The CDR profile may enable the data transfer system to periodically activate and deactivate a CDR circuit of the data transfer system based on the CDR profile to prevent an eye shift/collapse when transferring data between the master and the slave. The CDR profile may comprise one or more noise profiles. Each noise profile may comprise one or more profile entries. Each profile entry may include a CDR_ON time and a corresponding eye opening result. The CDR_ON time may specify a duration of a CDR_PERIOD in which the CDR circuit is active.

An exemplary data transfer system is disclosed. The data transfer system may comprise a master, a slave, a link coupling the master and the slave, and a memory configured to store a CDR (clock/data recovery) profile. The data transfer system may be configured to periodically activate and deactivate a CDR circuit of the data transfer system based on the CDR profile to prevent an eye shift/collapse when transferring data between the master and the slave. The CDR profile stored in the memory may be generated by a CDR profiler. The CDR profile may comprise one or more noise profiles. Each noise profile may comprise one or more profile entries. Each profile entry may include a CDR_ON time and a corresponding eye opening result. The CDR_ON time may specify a duration of a CDR_PERIOD in which the CDR circuit is active.

An exemplary apparatus is disclosed. The data transfer system may comprise means for generating a CDR (clock/data recovery) profile of a link. The link may couple a master and a slave of a data transfer system. The apparatus may also comprise means for periodically activating and deactivating a CDR circuit of the data transfer system based on the CDR profile to prevent an eye shift/collapse when transferring data between the master and the slave. The CDR profile may comprise one or more noise profiles. Each noise profile may comprise one or more profile entries. Each profile entry may include a CDR_ON time and a corresponding eye opening result. The CDR_ON time may specify a duration of a CDR_PERIOD in which the CDR circuit is active.

BRIEF DESCRIPTION OF THE DRAWINGS

The accompanying drawings are presented to aid in the description of examples of one or more aspects of the disclosed subject matter and are provided solely for illustration of the examples and not limitation thereof.

DETAILED DESCRIPTION

Aspects of the subject matter are provided in the following description and related drawings directed to specific examples of the disclosed subject matter. Alternates may be devised without departing from the scope of the disclosed subject matter. Additionally, well-known elements will not be described in detail or will be omitted so as not to obscure the relevant details.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments of the disclosed subject matter include the discussed feature, advantage or mode of operation.

The terminology used herein is for the purpose of describing particular examples only and is not intended to be limiting. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, processes, operations, elements, and/or components, but do not preclude the presence or addition of one or more other features, integers, processes, operations, elements, components, and/or groups thereof.

Further, many examples are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer-readable storage medium having stored therein a corresponding set of computer instructions that upon execution would cause an associated processor to perform the functionality described herein. Thus, the various aspects may be embodied in a number of different forms, all of which have been contemplated to be within the scope of the claimed subject matter. In addition, for each of the examples described herein, the corresponding form of any such examples may be described herein as, for example, "logic configured to" perform the described action.

Figure 1:
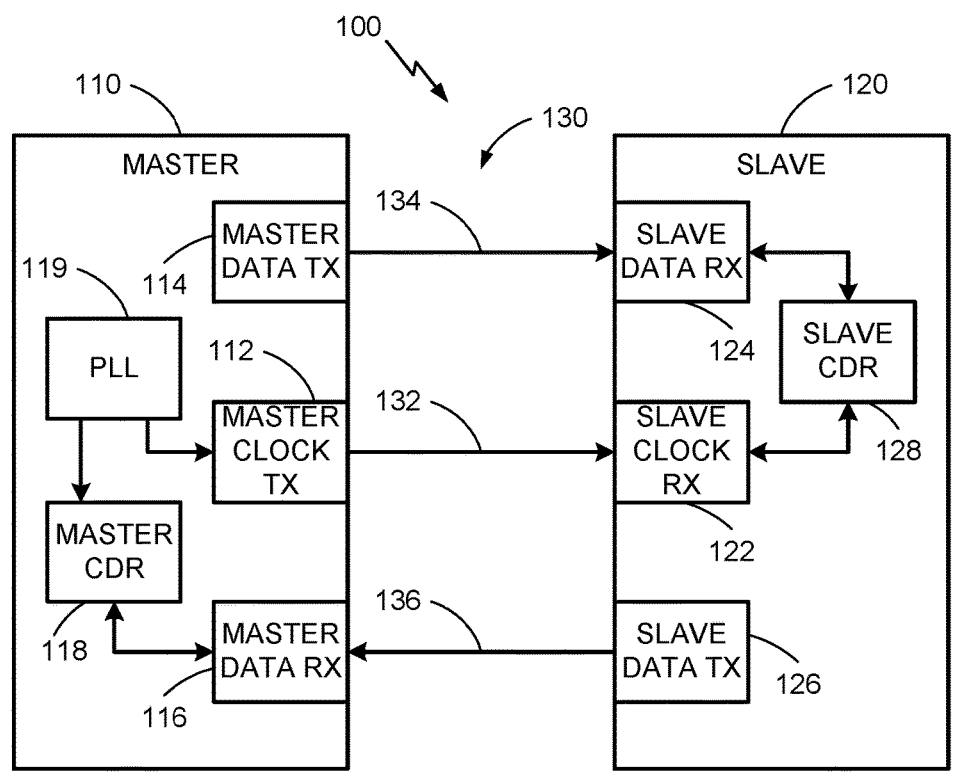
FIG. 1 illustrates an example of a source-synchronous data transfer system between master and slave devices.

FIG. 1 illustrates an example of a data transfer system 100. The data transfer system 100 may include a master device 110 (or simply a master 110), a slave device 120 (or simply a slave 120), and a link 130 configured to couple the master 110 with the slave 120. The master 110 may include a master clock transmitter 112, a master data transmitter 114, a master data receiver 116, a master CDR 118, and a phase-locked loop (PLL). The slave 120 may include a slave clock receiver 122, a slave data receiver 124, a slave data transmitter 126, and a slave CDR 128. The link 130, which may be a die-to-die or chip-to-chip link, may include a clock lane 132, a master-to-slave (M2S) data lane 134, and a slave-to-master (S2M) data lane 136. The clock lane 132 may be configured to couple the master clock transmitter 112 with the slave clock receiver 122, the M2S data lane 134 may be configured to couple the master data transmitter 114 with the slave data receiver 124, and the S2M data lane 136 may be configured to couple the master data receiver 116 with the slave data transmitter 126. The data transfer system 100 is source-synchronous in that the clock signal is provided by the master 110.

The master clock transmitter 112 may be configured to transmit a clock signal to the slave clock receiver 122 over the clock lane 132. Thus, the master clock transmitter 112 may be an example of means for transmitting a clock signal, the slave clock receiver 122 may be an example of means for receiving a clock signal, and the clock lane 132 may be an example of means for carrying a clock signal. In an aspect, the clock signal may be a differential signal, in which instance the clock lane 132 may be implemented in two lines configured to carry the complementary clock signals. In another aspect, the clock signal may be a single signal, in which instance the clock lane 132 may be implemented as a single line.

The master data transmitter 114 may be configured to transmit M2S data to the slave data receiver 124 over the M2S data lane 134. Thus, the master data transmitter 114 may be an example of means for transmitting M2S data, the slave data receiver 124 may be an example of means for receiving M2S data, and the M2S data lane 134 may be an example of means for carrying M2S data. The master data transmitter 114 may be configured to synchronize the transmission of the M2S data with the clock signal transmitted by the master clock transmitter 112. The slave data receiver 124 may be configured to synchronize the reception of the M2S data with the clock signal received by the slave clock receiver 122.

The M2S data may be transmitted as serial data over the M2S data lane 134. In an aspect, the M2S data signal may be a differential signal, in which instance the M2S data lane 134 may be implemented in two lines configured to carry the complementary M2S data signals. In another aspect, the M2S data signal may be a single signal, in which instance the M2S data lane 134 may be implemented as a single line.

The master data receiver 116 may be configured to receive S2M data from the slave data transmitter 126 over the S2M data lane 132. Thus, the master data receiver 116 may be an example of means for receiving S2M data, the slave data transmitter 126 may be an example of means for transmitting S2M data, and the S2M data lane 136 may be an example of means for carrying S2M data. The master data receiver 116 may be configured to synchronize the reception of the S2M data with the clock signal transmitted by the master clock transmitter 112. The slave data transmitter 126 may be configured to synchronize the transmission of the S2M data with the clock signal received by the slave clock receiver 122.

The S2M data may be transmitted as serial data over the S2M data lane 136. In an aspect, the S2M data signal may be a differential signal, in which instance the S2M data lane 136 may be implemented in two lines configured to carry the complementary S2M data signals. In another aspect, the S2M data signal may be a single signal, in which instance the S2M data lane 136 may be implemented as a single line.

When turned on, or otherwise activated, the master CDR 118 and the slave CDR 128 may maintain stability of the link 130. In particular, when the master CDR 118 is on, or otherwise activated, the master data receiver 116 may be enabled to receive the S2M data from the slave 120 over the S2M data lane 136 with minimum errors. Also, when the slave CDR 128 is on, or otherwise activated, the slave data receiver 124 may be enabled to receive the M2S data from the master 110 over the M2S data lane 134 with minimum errors.

A desirable feature of a SERDES design is power savings. One way to achieve power savings is by keeping the CDR circuit OFF during most of the time when the link is active between the transmitter and receiver. For example, when the master 110 is the transmitter and the slave 120 is the receiver, i.e., when the master data transmitter 114 transmits the M2S data to the slave data receiver 124 over the M2S data lane 134, power savings may be achieved by keeping the slave CDR 128 OFF, or otherwise inactive, during most of the time the M2S data is being transferred. On the other hand, when the slave 120 is the transmitter and the master 110 is the receiver, i.e., when the slave data transmitter 126 transmits the S2M data to the master data receiver 116 over the S2M data lane 136, power savings may be achieved by keeping the master CDR 118 OFF, or otherwise inactive, during most of the time the S2M data is being transferred.

Figure 2A:
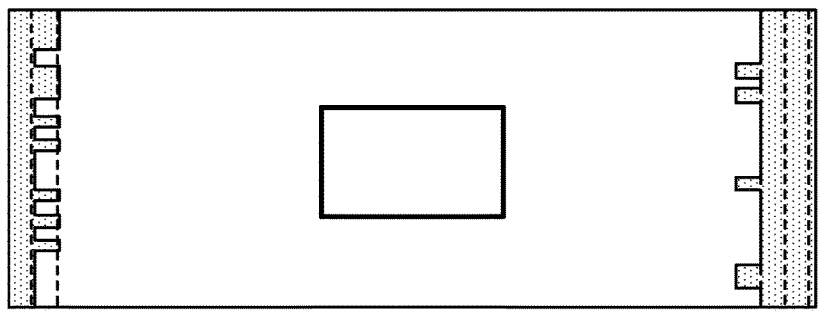
FIG. 2A illustrates a situation in which the CDR is at the eye center after initial training.
Figure 2B:
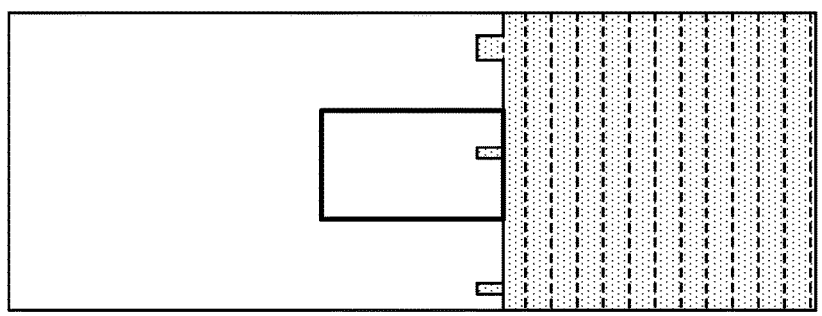
FIG. 2B illustrates a situation in which after the CDR is turned off, the eye shifts due to uncontrolled modulations.

However, due to voltage supply noise, temperature fluctuations and uncorrelated crosstalk, the receiver data may shift or the eye may collapse if the CDR is not turned ON to take care of these undesirable modulations. Such eye shift/collapse can cause link failures. FIG. 2A illustrates a situation in which the CDR is at the eye center after initial training. For example, at boot-up, the link may be initialized, and the CDR circuit may be allowed to calibrate. As a result, the eye may be centered, i.e., the link may be stabilized. FIG. 2B illustrates a situation in which the CDR is turned off, e.g., after the initial calibration, so as to save power. But as can be seen, due to uncontrolled modulations (voltage supply noise, temperature fluctuations, uncorrelated crosstalk, etc.), the eye can shift or collapse leading to the link becoming unstable.

The tradeoff is between power savings vs. link stability. To save the most amount of power within the context of maintaining link stability, the CDR may be turned ON initially for calibration and to place the CDR at the center of data (center of the eye) and turned OFF thereafter. But due to the above-mentioned aggressors, the CDR should be turned ON, at least periodically, to take care of any eye shift/collapse.

Unfortunately, there are many variables. A supplier may supply MDM/MSM and WTR chips to multiple customers, and each customer may have their own specific hardware designs. Some customers may pay significant attention to PDN (board level supply noise) and proper signal and power routing to have better eye margins while other customers may not very well optimize their board design. Hence there can be multiple PDN profiles and different eye margins.

A supplier can share with a customer a build optimized for power savings using that particular customer's reference design board for the CDR ON/OFF timing. But due to the differences among the customers, a build optimized for one customer may not work for another customer since the PDN/crosstalk can be different among different platforms. It is possible to relax the ON/OFF timing that is good enough to cover most or all platforms. Unfortunately, when the ON/OFF timing is relaxed, power saving is not optimized, which can lead to unsatisfactory power performance. This can put the supplier at a competitive disadvantage vis-à-vis other suppliers.

Customers also can try to optimize the CDR ON/OFF timing by performing long hours test with different time cycles and also hoping to see a worst noise event to confirm a stable link solution. Unfortunately, this can be a very time consuming process, and one that has to be repeated for each platform. Also, manufacturing deviations may be such that even within a platform, different boards may suffer from different levels of noise. This means that in practice, optimizing each device in the field cannot be done due to the long testing time that would be required.

To address such disadvantages that currently exist, it is proposed to generate a distribution of how much eye collapse can be recovered for different combinations of CDR ON/OFF times with various modulation frequencies. For example, lookup tables (LUT) of the distributions may be generated. Then for a specific source-synchronous implementation (e.g., between serially linked devices), the LUTs may be referenced to determine the particular CDR ON/OFF timing to be applied that allows maximum power savings to be achieved within the context of maintaining link stability. The LUTs may be individualized to each specific board. Also, the LUTs may be generated in the field, e.g., during boot-up or even on the fly during operation.

The described concept is a compact time solution, and is applicable in general to any source-synchronous SERDES (serializer/deserializer) implementations which want to optimize power savings and link stability vs. CDR ON/OFF time. Also it can be quickly put to test to optimize timings even on a remote platform accessible to application engineer or to the OEM (Original Equipment Manufacturer). While the description focuses on source-synchronous SERDES implementations, the described concepts may be applicable to other environments in which devices communicate with each other over high speed links.

Figure 3:
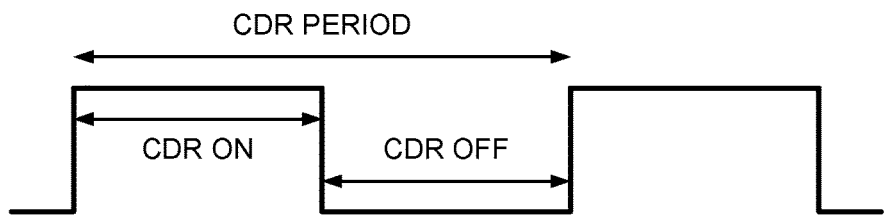
FIG. 3 illustrates a CDR timing definition.

FIG. 3 illustrates a CDR timing definition and is reflected in equation 1:

$$CDR\_PERIOD = CDR\_ON + CDR\_OFF \qquad (1)$$

In an aspect, the parameters of equation 1 may be optimized for power savings and link stability.

Figure 4:
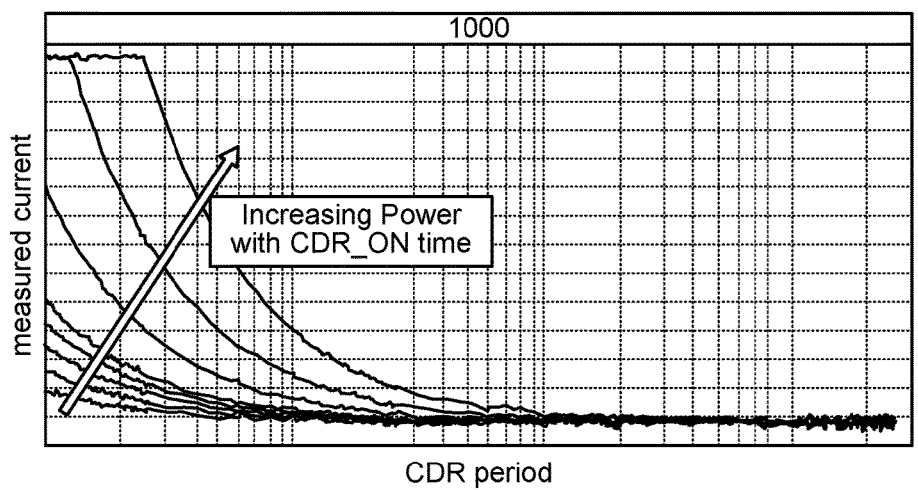
FIG. 4 illustrates an example graph of current consumption vs. CDR_PERIOD and CDR_ON times.

FIG. 4 is a graph that illustrates current consumption vs. CDR_PERIOD and CDR_ON times, e.g., of a source-synchronous SERDES design between a transmitter and a receiver. The X-axis represents the CDR_PERIOD and the Y-axis represents the current. In FIG. 4, each graph line represents different CDR_ON times. Then for each graph line, the CDR_ON time of that graph line as a percentage of the CDR_PERIOD decreases/increases as the CDR_PERIOD increases/decreases. This means that the left portion of FIG. 4 represents increased CDR_ON times (as a percentage of the CDR_PERIOD) and the right portion represents decreased CDR_ON times (as a percentage of the CDR_PERIOD).

As expected, as the CDR_ON time increases, the current (and hence power consumed) also increases. That is, when the CDR_ON time is a dominant portion of the CDR period, the power consumption is greater. Therefore, the CDR_ON times do have power consumption consequences. It should be noted that such absolute power consumption with multiple CDR_ON times are NOT platform dependent. Therefore, measurements made as represented in FIG. 4 are one time measurements that can be performed, e.g., by the supplier and distributed to the customers.

FIG. 4 also shows that with short CDR_ON times (e.g., bottom four graph lines), the differences in the amount of power consumed can be minimal even with short CDR_PERIODs. Thus, investigating the effects of short CDR_ON times, regardless of the length of the CDR_PERIOD, may not return much useful information. On the other hand, the differences in the power consumed can be significant for longer CDR_ON times (e.g., top four graph lines). Therefore, investigating the effects of long CDR_ON times is likely to return useful information.

One way to optimize power savings while maintaining link stability is to determine a minimum CDR_ON time (e.g., as a percentage of the total CDR_PERIOD) that would meet a desired threshold eye opening. To make such determinations, it is broadly proposed to artificially create noise on the receiver data such that the receiver eye can be closed when the CDR circuit of the receiver is OFF. The noise can either be injected on the incoming receiver data/clock or indirectly provided on the power supply or by any other means. Thereafter, the CDR circuit may be turned on (activated) for varying amount of time and the results can be monitored and recorded, to arrive at one or more CDR profiles.

Figure 5:
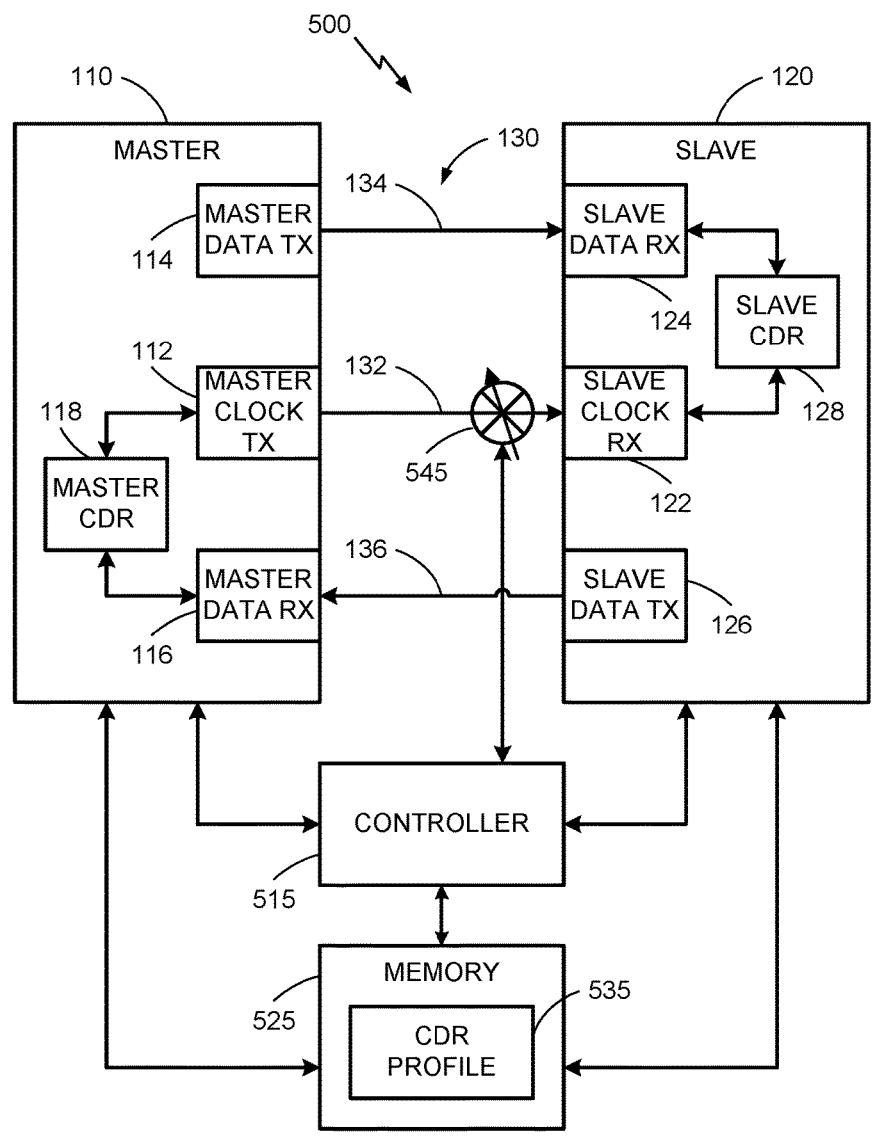
FIG. 5 illustrates an example of a CDR profile generator configured to generate a CDR profile of a link between a master and a slave of a data transfer system.

FIG. 5 illustrates an example of a CDR profile generator 500 configured to generate a CDR profile 535 of the link 130 between the master 110 and the slave 120 of the data transfer system 100. Again, the link 130 may be a die-to-die link or a chip-to-chip link. The CDR profile generator 500, which may be an example of means for generating CDR profiles, may include a controller 515 and a noise injector 545. The controller 515 may be configured to control an overall operation of the CDR profile generator 500 to generate the CDR profile 535 and store the result in a memory 525 accessible by the data transfer system 100.

The memory 525 may be a part of the data transfer system 100 and may be configured to store the CDR profile 535. If the data transfer system 100 and the CDR profile generator 500 are incorporated in a single apparatus, the memory 525 may also be a part of the CDR profile generator 500. The memory 525 may be a volatile or a non-volatile storage device, and may be an example of means for storing CDR profiles 535. The noise injector 545 may be configured to inject noise into the link 130. The noise injector 545 may be an example of means for injecting noise.

Generally, the controller 515 may specify or otherwise cause the noise injector 545 to inject noise into the link 130. The controller 515 may also specify or otherwise cause the master CDR 118 and/or the slave CDR 128 to turn ON/OFF, monitor the resulting effects to generate the CDR profile 535, and store the CDR profile 535 in the memory 525. Then during operation, the master CDR 118 and/or the slave CDR 128 may be periodically activated based on the CDR profile 535 to achieve power savings while maintaining the stability of the link 130.

Assume that the noise injector 545 injects noise into the clock lane 132. When the slave 120 is the receiver, then during normal operation, the slave data receiver 124 may synchronize the sampling of the M2S data based on the clock signal received by the slave clock receiver 122. Thus, the noise on the clock lane 132 can cause sampling errors by the slave data receiver 124 if the slave CDR 128 is not active.

Similarly, when the master 110 is the receiver, then during normal operation, the slave data transmitter 126 may synchronize the transmission of the S2M data based on the clock signal received by the slave clock receiver 122. Also during normal operation, the master data receiver 116 may synchronize the sampling of the S2M data based on the clock signal transmitted by the master clock transmitter 112. The noise on the clock lane 132 can disrupt the synchronization between the slave data transmitter 126 transmitting the S2M data and the master data receiver 116 sampling the S2M data. In other words, the noise on the clock lane 132 can cause sampling errors by the master data receiver 116 if the master CDR 118 is not active.

For the discussion of the CDR profile generator 500, it is assumed that the slave 120 is the receiver, and that the receiver clock—the clock lane 132—will be injected with noise by the noise injector 545. Of course, most if not all of the discussion will be applicable when the master 110 is the receiver. In an aspect, the noise may be a single modulation frequency tone with varying phase amplitudes. This artificially closes the receiver eye if the CDR is OFF. Instead of keeping the CDR OFF, the CDR ON time settings vs. varying phases with a specific modulation frequency is swept. This provides a distribution about how much eye collapse is recovered for a specific CDR ON time with a specific modulation frequency.

Figure 6A:
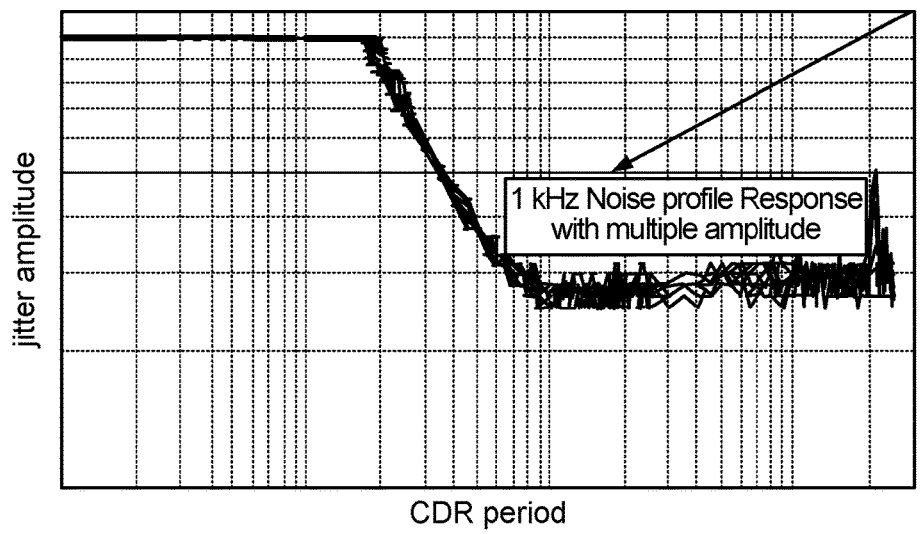
FIGS. 6A and 6B represent example graphs of the noise response vs. CDR_PERIOD and CDR_ON times for different noise frequencies.
Figure 6B:
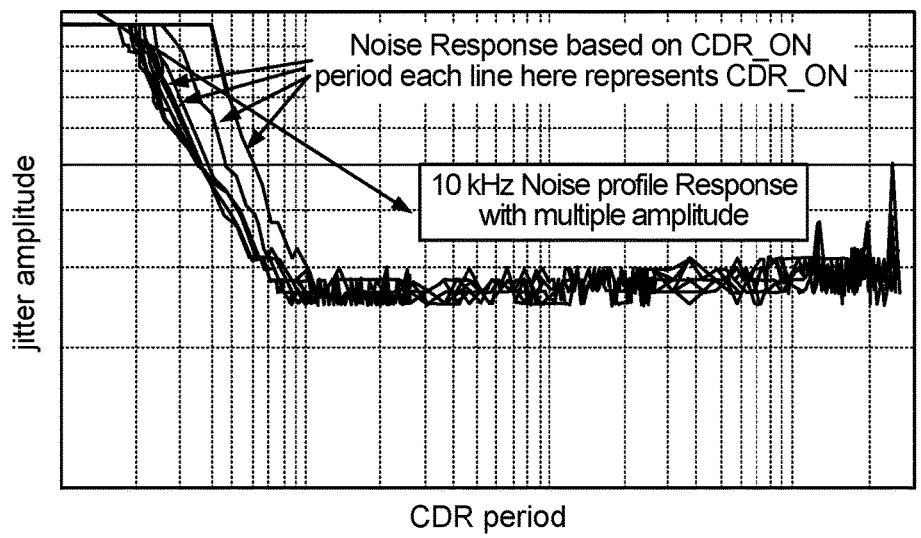

FIGS. 6A and 6B represent example graphs of the noise response vs. CDR_PERIOD and CDR_ON times. The X-axis represents the CDR_PERIOD and the Y-axis represents the jitter. FIGS. 6A and 6B respectively represent graphs in which the receiver clock is modulated with 1 and 10 KHz noise (modulation) frequencies on a particular platform. Each graph line in each of the FIGS. 6A, 6B represents noise responses based on different CDR_ON times. The process of modulating with different amplitudes can be repeated with different modulation frequencies to generate the CDR profile 535 for the following:

CDR_PERIOD;
CDR_ON Time;
Modulation (noise) frequencies;
Modulation (noise) phase amplitudes.

Figure 7:
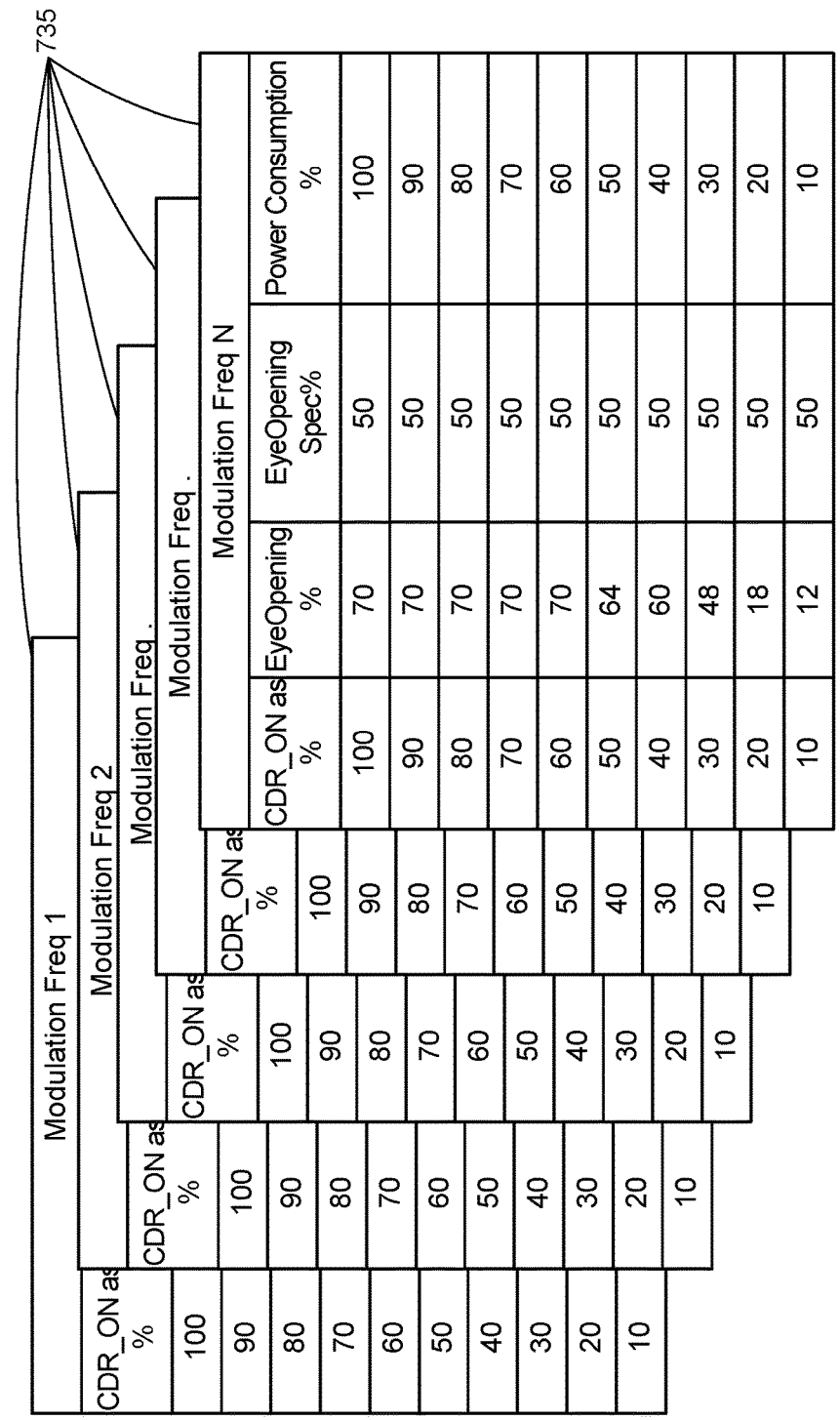
FIG. 7 illustrates examples a CDR profile stored as noise profiles in a lookup table.

In an aspect, the CDR profile 535 may comprise one or more noise profiles 735. The generated noise profiles may be stored in the memory 525 as lookup tables (LUTs). FIG. 7 illustrates examples of noise profiles 735 for different modulation frequencies. For each table, different CDR_ON times may be applied and the resulting Eye openings may be measured or otherwise determined. The eye opening spec (also referred to as eye opening threshold) may represent minimum thresholds that can be set (by the end user, manufacturer, designer, etc.) for link stability. That is, the eye opening threshold may specify a minimum acceptable eye opening for preventing the eye shift/collapse. The power consumption numbers can be provided beforehand since these are NOT platform dependent.

Typically, even if the data transmission rate is very high on the link 130 (e.g., into multi GHz range), the frequencies of noise that is typically experienced is generally much lower, e.g., from KHz to MHz ranges. This can be used to limit the number of modulation frequencies, and hence limit the number of tables, so as to be manageable while achieving good results. As an illustration, the modulation frequency tones can be increased logarithmically. For example, if the expected noise modulation frequencies range between 1 KHz and 10 MHz, then the tables for modulation frequency tones of 1 KHz, 10 KHz, 100 KHz, 1 MHz and 10 MHz can be generated for a total of six noise profiles 735. Of course, this is merely an example, and the number of tables can be less or more. The frequency tones can be customer based on the customer's platform, which can further reduce test time.

Figure 8:
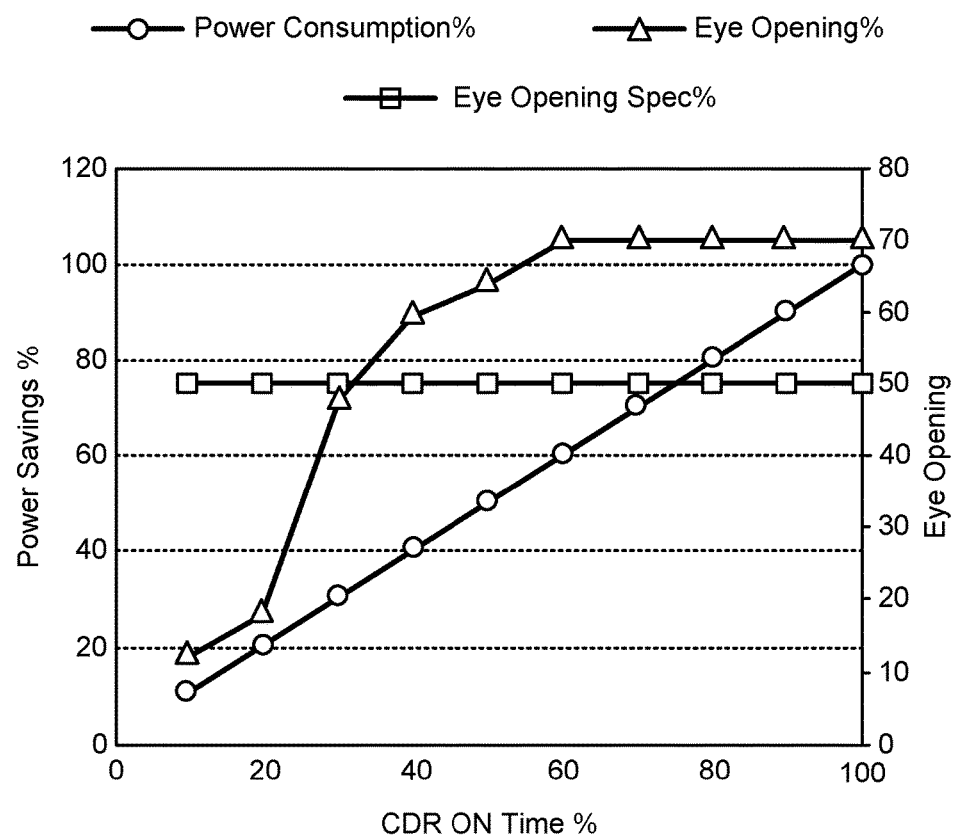
FIG. 8 represents a graphical equivalent of an example noise profile.

After the noise profiles 735 are generated, they may be consulted during operation to optimize the combination of power savings and link stability. FIG. 8 represents a graphical equivalent of the "Modulation Frequency N" noise profile 735 of FIG. 7. According to the noise profile 735, a minimum eye opening threshold to achieve link stability in the presence of noise is set at 50%. Therefore, setting the CDR_ON time to be 40% of the CDR_PERIOD will be sufficient to meet the eye opening threshold to maintain the link stability.

Thus, during operation, when the slave 120 is receiving data from the master 110, the slave CDR 128 may be turned on and off periodically such that the CDR_ON time of the slave CDR 128 is 40% of the CDR_PERIOD. Conversely, when the master 110 is receiving data from the slave 120, the master CDR 118 may be turned on and off periodically such that the CDR_ON time of the master CDR 118 is 40% of the CDR_PERIOD. Setting a higher CDR_ON time will likely result in increased power consumption without a corresponding increase in the link stability.

In an aspect, different noise profiles 735 may be generated for different CDR circuits. For example, a number of noise profiles 735 may be generated for the master CDR 118 and a same or different number of noise profiles 735 may be generated for the slave CDR 128. In this way, the differences among the individual CDR circuits within the same device may be accommodated.

It is noted that a SERDES interface of a receiver can react differently to different modulation frequencies. For example, a first noise profile 735 for a first modulation frequency may indicate that a CDR_ON time of 40% is necessary to meet the eye opening threshold requirement, and a second noise profile 735 for a second modulation frequency may indicate that a CDR_ON time of 50% is necessary to meet the same eye opening threshold requirement. In such instances, the noise profile 735 of the "worst" modulation frequency may be consulted to set the CDR_ON times during operation. In the above-example, the second noise profile 735 would be consulted.

In an alternative, if the noise is dominated by a particular modulation frequency, then the noise profile 735 of the dominant frequency may be selected for consultation. If the noise profile 735 for the dominant frequency has not been generated, then the noise profile 735 for the frequency closest to the dominant frequency may be chosen.

In an aspect, the CDR profile generator 500 and data transfer system 100 may be incorporated in a same apparatus (e.g., PDA, smart phone, and so on). The CDR profile generator 500 may be a part of on-board diagnostic components distributed with each apparatus. For example, existing DFT (distribution-for-testing) components of the apparatus may be repurposed. One advantage is that the generated CDR profile 535 may be customized for the individual apparatus. Another advantage is that the CDR profile 535 can adapt to the changes that the apparatus may undergo over time. For example, the CDR profile 535 may be generated at boot-up. In another example, the CDR profile 535 may be generated on the fly, i.e., generated dynamically during operation of the device.

Figure 9:
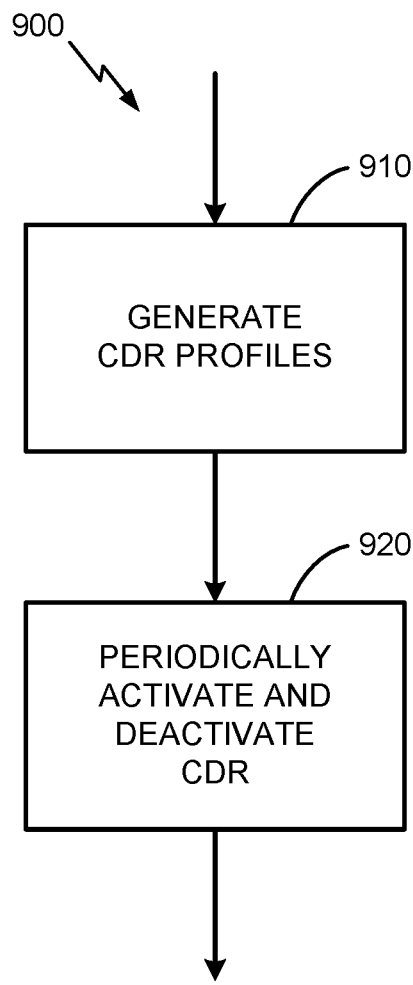
FIG. 9 illustrates a flow chart of an example method to generate and utilize a CDR profile.

FIG. 9 illustrates a flow chart of an example method 900 performed by the CDR profile generator 500 and by the data transfer system 100. In an aspect, both may be incorporated in a single apparatus. In block 910, the CDR profile generator 500 may generate a CDR profile 535 of the link 130 that couples the master 110 and the slave 120 of the data transfer system 100. The link 130 may be a high-speed SERDES link, and the data transfer system 100 may be a source synchronous system.

Figure 10:
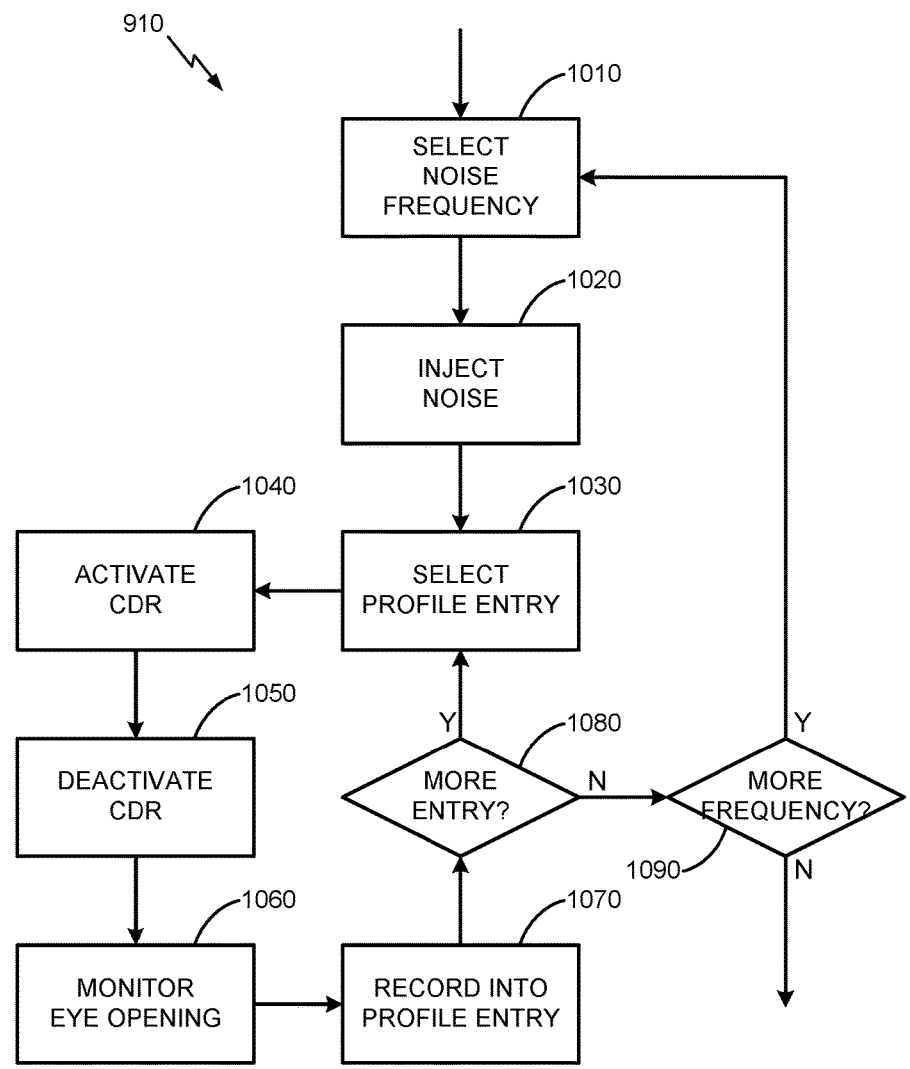
FIG. 10 illustrates a flow chart of an example process to generate a CDR profile.

FIG. 10 illustrates a flow chart of an example process to implement block 910. Before proceeding further, it should be noted that not all illustrated blocks of FIGS. 9 and 10 need to be performed, i.e., some blocks may be optional. Also, the numerical references to the blocks in FIGS. 9 and 10 should not be taken as requiring that the blocks should be performed in a certain order. Indeed, some blocks may be performed concurrently.

In block 1010, the controller 515 may select a modulation frequency corresponding to each of the one or more noise profiles 735. In block 1020, the noise injector 545 may inject noise of the selected modulation frequency into the data transfer system 100. The injected noise may be sufficient to cause the eye to collapse when the CDR circuit (e.g., the master CDR 118 and/or the slave CDR 128) is inactive. The noise may be injected into the clock input, e.g., to the clock lane 132. Alternatively or in addition thereto, the noise may be injected into data input of the slave 120 (e.g., to the M2S data lane 134) and/or into the data input of the master 110 (e.g., to the S2M data lane 136).

In block 1030, the controller 515 may select a profile entry. In block 1040, the controller 515 may activate the CDR 118, 128 in accordance with the CDR_ON time of the profile entry. Thereafter, in block 1050, the controller 515 may deactivate the CDR circuit 118, 128 for a remainder of the CDR_PERIOD of the profile entry. In block 1060, the controller 515 may monitor the resulting eye opening. In block 1070, the controller 515 may record the CDR_ON time and the eye opening in the profile entry. The profile entry may also include the power consumption value. If included, these power consumption value entries may be prepopulated externally, i.e., without operating the master 110 and the slave 120. The profile entry may further include an eye opening threshold (eye opening spec %). This may also be prepopulated.

In block 1080, the controller 515 may determine whether or not there are other profile entries that should be populated. If so, the process may proceed back to block 1030. If not, then the process may proceed to block 1090. If the process does proceed to block 1030, this may be an indication that the noise profile 735 of the selected noise, i.e., of the selected modulation frequency, is populated.

In block 1090, the controller 515 may determine whether or not there are other noise profiles 735 that should be populated. If so, the process may proceed back to block 1010. Otherwise, the process may finish, which may be an indication that the CDR profile 535 has been generated. Thereafter, the method 900 may proceed to block 920 in FIG. 9.

In block 920, the data transfer system 100 may periodically activate and deactivate the CDR circuit 118, 128 based on the CDR profile 535 generated in block 910. The CDR circuit 118, 128 may be activated/deactivated so as to prevent eye shift/collapse when data is transferred between the master 110 and the slave 120 over the link 130.

Figure 11:
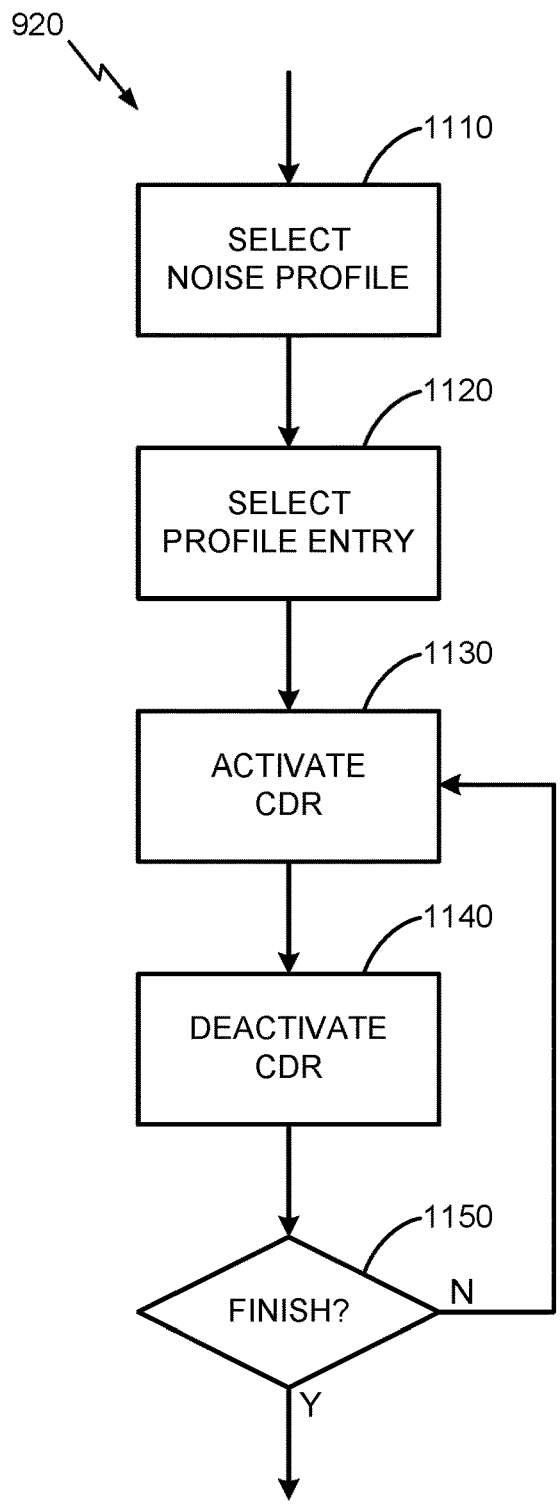
FIG. 11 illustrates a flow chart of an example process to periodically activate and deactivate a CDR circuit.

FIG. 11 illustrates a flow chart of an example process to implement block 920. Again, it is to be noted that not all illustrated blocks of FIG. 11 need to be performed, i.e., some blocks may be optional. Also, the numerical references to the blocks in FIG. 11 should not be taken as requiring that the blocks should be performed in a certain order. Indeed, some blocks may be performed concurrently.

In block 1110, the data transfer system 100 may select a noise profile 735 of the CDR profile 535, e.g., from the memory 525. In an aspect, if there are different noise profiles 735 for the different CDR circuits (e.g., for the master CDR 118 and for the slave CDR 128), an appropriate noise profile 735 may be selected for each CDR circuit 118, 128. For example, the master 110 may select a noise profile 735 and the slave 120 may select the same or different noise profile 735. As indicated above, the selected noise profile 735 maybe the "worst" modulation frequency noise profile 735.

Alternatively, the noise profile 735 of the dominant modulation frequency may be selected.

In block 1120, a profile entry of the noise profile 735 may be selected. In an aspect, any profile entry whose eye opening result is at or above a minimum eye opening threshold for preventing the eye shift/collapse. Preferably, among all the profile entries that meet the eye opening threshold, the entry with the smallest CDR_ON time is selected.

During each CDR_PERIOD when the data is transferred between the master 110 and the slave 120 over the link 130, the CDR circuit 118, 128 may be activated in accordance with the CDR_ON time of the selected profile entry in block 1130. Then in block 1140, the CDR circuit 118, 128 may be deactivated for the remainder of the CDR_PERIOD. In block 1150, the data transfer system 100 (one or both of the master 110 and the slave 120) may determine whether to finish the process or not. For example, if the data transfer has completed, the process may finish. Otherwise, the process may continue.

If it is determined that the process should finish in block 1150, then the process may end. If not, then the process may proceed to block 1130 so that the CDR circuit 118, 128 may be activated and deactivated for another CDR period.

Figure 12:
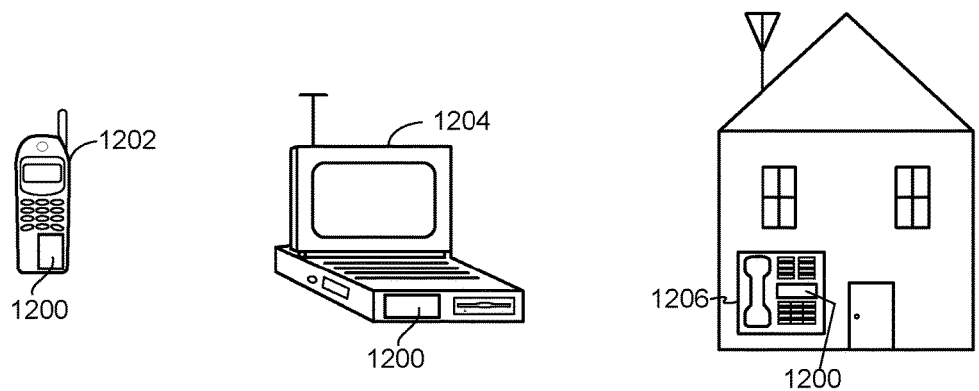
FIG. 12 illustrates examples of devices with an apparatus integrated therein.

FIG. 12 illustrates various electronic devices that may be integrated with the aforementioned apparatus illustrated in FIGS. 1 and 5. For example, a mobile phone device 1202, a laptop computer device 1204, a terminal device 1206 as well as wearable devices, portable systems, that require small form factor, extreme low profile, may include an apparatus 1200 that incorporates the devices/systems as described herein. The apparatus 1200 may be, for example, any of the integrated circuits, dies, integrated devices, integrated device packages, integrated circuit devices, device packages, integrated circuit (IC) packages, package-on-package devices, system-in-package devices described herein. The devices 1202, 1204, 1206 illustrated in FIG. 12 are merely exemplary. Other electronic devices may also feature the apparatus 1200 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithms described in connection with the examples disclosed herein may be implemented as electronic hardware, computer software, or combinations of both. To clearly illustrate this interchangeability of hardware and software, various illustrative components, blocks, modules, circuits, and methods have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The methods, sequences and/or algorithms described in connection with the examples disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled with the processor such that the processor can read information from, and write information to, the storage medium. In the alternative, the storage medium may be integral to the processor.

Accordingly, an aspect can include a computer-readable media embodying any of the devices described above. Accordingly, the scope of the disclosed subject matter is not limited to illustrated examples and any means for performing the functionality described herein are included.

While the foregoing disclosure shows illustrative examples, it should be noted that various changes and modifications could be made herein without departing from the scope of the disclosed subject matter as defined by the appended claims. The functions, processes and/or actions of the method claims in accordance with the examples described herein need not be performed in any particular order. Furthermore, although elements of the disclosed subject matter may be described or claimed in the singular, the plural is contemplated unless limitation to the singular is explicitly stated.

What is claimed is:

1. A method, comprising:
   generating, by a CDR (clock/data recovery) profile generator, a CDR profile of a link coupling a master and a slave of a data transfer system; and
   periodically activating and deactivating, by the data transfer system, a CDR circuit of the data transfer system based on the CDR profile to prevent an eye shift/collapse when transferring data between the master and the slave,
   wherein the CDR profile comprises one or more noise profiles, each noise profile comprising one or more profile entries, each profile entry including a CDR_ON time and a corresponding eye opening result, and
   wherein the CDR_ON time specifies a duration of a CDR_PERIOD in which the CDR circuit is active.

2. The method of claim 1,
   wherein the link is a high-speed SERDES (serializer/deserializer) link, and
   wherein the data transfer system is a source synchronous system.

3. The method of claim 1, wherein the one or more noise profiles of the CDR profile are stored in a memory as LUTs (lookup tables).

4. The method of claim 1, wherein the CDR profile is generated through operating the master and/or through operating the slave.

5. The method of claim 1, wherein generating the CDR profile comprises:
   for each of the one or more noise profiles of the CDR profile, injecting a noise corresponding to that noise profile into the data transfer system, the injected noise being sufficient to cause an eye collapse when the CDR circuit is inactive; and while the noise is being injected, for each profile entry of that noise profile:
activating the CDR circuit in accordance with the CDR_ON time of that profile entry and deactivating the CDR circuit for a remainder of the CDR_PERIOD;
monitoring the eye opening result of the link in response to activating the CDR circuit in accordance with the CDR_ON time of that profile entry; and
recording the CDR_ON time and the eye opening result in that profile entry.

6. The method of claim 5,
wherein each noise profile corresponds to a modulation frequency, and
wherein injecting the noise comprises injecting the modulation frequency of that noise profile.

7. The method of claim 6, wherein injecting the noise comprises injecting the modulation frequency to any one or more of a clock input of the slave, a data input of the slave, a data input of the master, and a power supply of the data transfer system.

8. The method of claim 1, wherein each profile entry of each noise profile further includes a power consumption value specifying an amount of power consumed when the CDR circuit is activated according to the CDR_ON time of that profile entry.

9. The method of claim 8, wherein for each profile entry of each noise profile, the power consumption value is externally determined without operating the master and without operating the slave.

10. The method of claim 1, wherein periodically activating and deactivating the CDR circuit based on the CDR profile comprises:
selecting a noise profile from the CDR profile;
selecting, from the selected noise profile, a profile entry whose eye opening result is at or above an eye opening threshold, the eye opening threshold specifying a minimum acceptable eye opening for preventing the eye shift/collapse; and
during each CDR_PERIOD when the data is transferred between the master and the slave,
activating the CDR circuit for the CDR_ON time of the selected profile entry during the CDR_PERIOD; and
deactivating the CDR circuit for a remainder of the CDR_PERIOD.

11. The method of claim 10,
wherein each noise profile further includes the eye opening threshold, and
wherein selecting the profile entry comprises selecting the profile entry whose CDR_ON time is smallest among all profile entries whose eye opening result is equal to or greater than the eye opening threshold.

12. An apparatus, comprising:
a data transfer system comprising a master, a slave, and a link coupling the master and the slave; and
a CDR (clock/data recovery) profile generator configured to generate a CDR profile of the link,
wherein the CDR profile comprises one or more noise profiles, each noise profile comprising one or more profile entries, each profile entry including a CDR_ON time and a corresponding eye opening result,
wherein the CDR_ON time specifies a duration of a CDR_PERIOD in which a CDR circuit of the data transfer system is active, and wherein the data transfer system is configured to periodically activate and deactivate the CDR circuit based on the CDR profile to prevent an eye shift/collapse when transferring data between the master and the slave.

13. The apparatus of claim 12,
wherein the link is a high-speed SERDES (serializer/deserializer) link, and
wherein the data transfer system is a source synchronous system.

14. The apparatus of claim 12, further comprising a memory,
wherein the CDR profile generator is configured store the one or more noise profiles of the CDR profile as LUTs (lookup tables) in the memory, and
wherein the data transfer system is configured to periodically activate and deactivate the CDR circuit based on the one or more noise profiles of the CDR profile stored in the memory.

15. The apparatus of claim 12, wherein the CDR profile generator is configured to generate the CDR profile through operating the master and/or through operating the slave.

16. The apparatus of claim 12, wherein the CDR profile generator is configured to generate the CDR profile by:
for each of the one or more noise profiles of the CDR profile, injecting a noise corresponding to that noise profile into the data transfer system, the injected noise being sufficient to cause an eye collapse when the CDR circuit is inactive; and
while the noise is being injected, for each profile entry of that noise profile:
activating the CDR circuit in accordance with the CDR_ON time of that profile entry and deactivating the CDR circuit for a remainder of the CDR_PERIOD;
monitoring the eye opening result of the link in response to activating the CDR circuit in accordance with the CDR_ON time of that profile entry; and
recording the CDR_ON time and the eye opening result in that profile entry.

17. The apparatus of claim 16,
wherein each noise profile corresponds to a modulation frequency, and
wherein the CDR profile generator is configured to inject the modulation frequency of that noise profile.

18. The apparatus of claim 17, wherein the CDR profile generator is configured to inject the modulation frequency to a clock input of the slave, to a data input of the slave, to a data input of the master, or to a power supply of the data transfer system.

19. The apparatus of claim 12, wherein each profile entry of each noise profile further includes a power consumption value specifying an amount of power consumed when the CDR circuit is activated according to the CDR_ON time of that profile entry.

20. The apparatus of claim 19, wherein for each profile entry of each noise profile, the power consumption value is externally determined without operating the master and without operating the slave.

21. The apparatus of claim 12, wherein the data transfer system is configured to:
select a noise profile from the CDR profile;
select, from the selected noise profile, a profile entry whose eye opening result is at or above an eye opening threshold, the eye opening threshold specifying a minimum acceptable eye opening for preventing the eye shift/collapse; and during each CDR_PERIOD when the data is transferred between the master and the slave,
activate the CDR circuit for the CDR_ON time of the selected profile entry during the CDR_PERIOD; and
deactivate the CDR circuit for a remainder of the CDR_PERIOD.

22. The apparatus of claim 20,
wherein each noise profile further includes the eye opening threshold, and
wherein the data transfer system is configured to select the profile entry whose CDR_ON time is smallest among all profile entries whose eye opening result is equal to or greater than the eye opening threshold.

23. The apparatus of claim 20, wherein the CDR profile generator is configured to generate the CDR profile during a boot-up of the apparatus, during a normal operation of the apparatus, or both.

24. The apparatus of claim 12, wherein the apparatus is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

25. A CDR (clock/data recovery) profile generator, comprising:
a controller and a noise injector together configured to generate a CDR profile of a link coupling a master and a slave of a data transfer system,
wherein the CDR profile enables the data transfer system to periodically activate and deactivate a CDR circuit of the data transfer system based on the CDR profile to prevent an eye shift/collapse when transferring data between the master and the slave, and
wherein the CDR profile comprises one or more noise profiles, each noise profile comprises one or more profile entries, and each profile entry includes a CDR_ON time and a corresponding eye opening result, the CDR_ON time specifying a duration of a CDR_PERIOD in which the CDR circuit is active.

26. The CDR profile generator of claim 25,
wherein the link is a high-speed SERDES (serializer/deserializer) link, and
wherein the data transfer system is a source synchronous system.

27. The CDR profile generator of claim 25, wherein the controller is configured to store the one or more noise profiles of the CDR profile as LUTs (lookup tables) in a memory accessible by the data transfer system.

28. The CDR profile generator of claim 25, wherein the controller is configured to generate the CDR profile through operating the master and/or through operating the slave.

29. The CDR profile generator of claim 25,
wherein for each of the one or more noise profiles of the CDR profile, the noise injector is configured to inject a noise corresponding to that noise profile into the data transfer system, the injected noise being sufficient to cause an eye collapse when the CDR circuit is inactive; and
while the noise is being injected, the controller is configured to perform, for each profile entry of each noise profile,
activate the CDR circuit in accordance with the CDR_ON time of that profile entry and deactivate the CDR circuit for a remainder of the CDR_PERIOD;
monitor the eye opening result of the link in response to activating the CDR circuit in accordance with the CDR_ON time of that profile entry; and
record the CDR_ON time and the eye opening result in that profile entry.

30. The CDR profile generator of claim 29,
wherein each noise profile corresponds to a modulation frequency, and
wherein the noise injector is configured to inject the modulation frequency of that noise profile.

31. The CDR profile generator of claim 30, wherein the noise injector is configured to inject the modulation frequency to a clock input of the slave, to a data input of the slave, to a data input of the master, or to a power supply of the data transfer system.

32. The CDR profile generator of claim 25,
wherein a single apparatus incorporates the CDR profile generator and the data transfer system,
wherein the CDR profile generator is configured to generate the CDR profile during a boot-up of the apparatus, during a normal operation of the apparatus, or both.

33. A data transfer system, comprising:
a master, a slave, a link coupling the master and the slave, and a memory configured to store a CDR (clock/data recovery) profile,
wherein the data transfer system is configured to periodically activate and deactivate a CDR circuit of the data transfer system based on the CDR profile to prevent an eye shift/collapse when transferring data between the master and the slave, and
wherein the CDR profile stored in the memory is generated by a CDR profile generator,
wherein the CDR profile comprises one or more noise profiles, each noise profile comprising one or more profile entries, and each profile entry including a CDR_ON time and a corresponding eye opening result, and
wherein the CDR_ON time specifying a duration of a CDR_PERIOD in which the CDR circuit of the data transfer system is active.

34. An apparatus, comprising:
means for generating a CDR (clock/data recovery) profile of a high-speed SERDES (serializer/deserializer) link coupling a master and a slave of a data transfer system; and
means for periodically activating and deactivating a CDR circuit of the data transfer system based on the CDR profile to prevent an eye shift/collapse when transferring data between the master and the slave,
wherein the CDR profile comprises one or more noise profiles, each noise profile comprising one or more profile entries, each profile entry including a CDR_ON time and a corresponding eye opening result, and
wherein the CDR_ON time specifies a duration of a CDR_PERIOD in which the CDR circuit is active.

* * * * *